(12) United States Patent
Mou et al.

(10) Patent No.: US 12,107,071 B2
(45) Date of Patent: Oct. 1, 2024

(54) SYSTEM-IN-PACKAGE CHIP OF PRINTER DRIVER SYSTEM

(71) Applicant: MICROJET TECHNOLOGY CO., LTD., Hsinchu (TW)

(72) Inventors: Hao-Jan Mou, Hsinchu (TW);
Ching-Sung Lin, Hsinchu (TW);
Yung-Lung Han, Hsinchu (TW);
Chi-Feng Huang, Hsinchu (TW);
Chin-Wen Hsieh, Hsinchu (TW);
Tsung-I Lin, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 357 days.

(21) Appl. No.: 17/559,025

(22) Filed: Dec. 22, 2021

(65) Prior Publication Data

US 2022/0216181 A1 Jul. 7, 2022

(30) Foreign Application Priority Data

Jan. 6, 2021 (TW) .................................. 110100487

(51) Int. Cl.
| | |
|---|---|
| *H01L 23/498* | (2006.01) |
| *H01L 23/00* | (2006.01) |
| *H01L 25/00* | (2006.01) |
| *H01L 25/065* | (2023.01) |

(52) U.S. Cl.
CPC .... *H01L 25/0652* (2013.01); *H01L 23/49816* (2013.01); *H01L 24/16* (2013.01); *H01L 25/50* (2013.01); *H01L 2224/16153* (2013.01); *H01L 2924/15311* (2013.01)

(58) Field of Classification Search
CPC .......................... H01L 23/49816; H01L 24/16
See application file for complete search history.

(56) References Cited

U.S. PATENT DOCUMENTS

| | | | | |
|---|---|---|---|---|
| 2005/0155507 | A1* | 7/2005 | Vaidyanathan | .......... G03G 5/00 |
| | | | | 101/401.1 |
| 2009/0051043 | A1* | 2/2009 | Wong | ...................... H01L 24/83 |
| | | | | 257/E23.024 |

FOREIGN PATENT DOCUMENTS

| | | |
|---|---|---|
| TW | 201712897 A | 4/2017 |
| TW | 202025322 A | 7/2020 |
| TW | 202033703 A | 9/2020 |
| TW | I715257 B | 1/2021 |

\* cited by examiner

*Primary Examiner* — Errol V Fernandes
(74) *Attorney, Agent, or Firm* — Birch, Stewart, Kolasch & Birch, LLP

(57) ABSTRACT

A system-in-package chip of printer driver system applicable in a printer includes a first chip, a second chip, and a third chip. The first chip, the second chip, and the third chip are arranged in a common package. The first chip and the second chip are arranged side-by-side on a carrier in the common package. The third chip is arranged on a top portion of the first chip in the common package. A wire carrier structure is formed on the top portion of the first chip before the third chip is disposed on the first chip.

18 Claims, 8 Drawing Sheets

SYSTEM-IN-PACKAGE CHIP OF PRINTER DRIVER SYSTEM

CROSS-REFERENCE TO RELATED APPLICATION

This non-provisional application claims priority under 35 U.S.C. § 119(a) to Patent Application No. 110100487 filed in Taiwan, R.O.C. on Jan. 6, 2021, the entire contents of which are hereby incorporated by reference.

BACKGROUND

Technical Field

The present disclosure relates to system-level chip package technology, in particular, to a system-in-package chip of printer driver system.

Related Art

In recent years, printer technology has continued to make breakthroughs and innovations. The manufacturing technology of the printer refers to the conventional semiconductor manufacturing process to reduce manufacturing costs, especially in the aspect of ensuring the reliability of chip packaging components and reducing component size. In the field of semiconductor processing, the chips are made smaller and smaller to increase the speed, power, and efficiency thereof as well as reducing the size of the overall components. In some cases, chips are mounted side-by-side on the packaging substrate and connected together through a packaging substrate or directly connected to the wiring. In other cases, chips are mounted on the substrate one another for direct connection without any intermediate wirings or packaging substrates, which is sometimes referred as stacked chip packaging. Using a pick and pick machine or many other types of equipment, one chip can be placed on another chip, which then can be packaged to form a single chip with twice the height of the chip.

For example, chips can be manufactured with different processing features (e.g., 22 nm, 14 nm, or 10 nm). Through the combination of different processing features and different types of chips, chips made with different manufacturing processes and made by different manufacturers can be placed in the same single package. In the field of semiconductor chip packaging, several chips can be packaged into a single package, so that two or more different chips can be placed into a single package, which is sometimes referred as heterogeneous integration for chip connections.

In packaging technology, a redistribution layer (RDL) can be formed on a chip and electrically connected to an active device in the chip. Then input/output (I/O) connectors (such as solder balls on under bump metal (UBM)) can be formed, and the I/O connectors are electrically connected to the chip through the RDL. The advantageous feature of this packaging technology is the possibility of forming a fan-out package. Therefore, the I/O pads on the chip can be redistributed to cover an area which is larger than the area of the chip, and therefore the number of I/O pads on the surface of the packaged chip can be increased. Integrated fan-out (InFO) packaging technology is becoming more and more popular, especially when it is combined with wafer-level packaging (WLP) technology. The resulting packaging structures can provide high functional density with relatively lower cost and higher packaging performance.

SUMMARY

In one or some embodiments of the present disclosure, a system-in-package chip of printer driver system is provided. An object of the present disclosure is to perform a one-time packaging procedure for several chips with different function, thereby not only increasing the working efficiency, but also reducing the manufacturing costs and the component size.

In view of above object, in one embodiment of the present disclosure, a system-in-package chip of printer driver system is provided. The chip is applicable in a printer and includes a first chip, a second chip, and a third chip which are arranged in a common package. The first chip and the second chip are arranged side-by-side on a carrier in the common package. The third chip is arranged on a top portion of the first chip in the common package. A wire carrier structure is formed on the top portion of the first chip before the third chip is disposed on the first chip.

In view of above object, in another embodiment of the present disclosure, a system-in-package chip of printer driver system is provided. The chip is applicable in a printer and includes a first chip, a second chip, and a third chip which are arranged in a common package. The first chip, the second chip, and the third chip are arranged in parallel and side-by-side in the common package.

In view of above object, in yet another embodiment of the present disclosure, a system-in-package chip of printer driver system is provided. The chip is applicable in a printer and includes a first chip, a second chip, and a third chip which are arranged in a common package. The first chip, the second chip, and the third chip are arranged vertically and stacked with each other in the common package.

In one embodiment, the first chip is a wireless communication chip, the second chip is a power integrated driver chip, and the third chip is a printing system single chip.

In one embodiment, the first chip is a wireless communication chip, the second chip is a printing system single chip, and the third chip is a power integrated driver chip.

In one embodiment, the first chip is a power integrated driver chip, the second chip is a wireless communication chip, and the third chip is a printing system single chip.

In one embodiment, the first chip is a power integrated driver chip, the second chip is a printing system single chip, and the third chip is a wireless communication chip.

In one embodiment, the first chip is a printing system single chip, the second chip is a wireless communication chip, and the third chip is a power integrated driver chip.

BRIEF DESCRIPTION OF THE DRAWINGS

The disclosure will become more fully understood from the detailed description given herein below, for illustration only and thus not limitative of the disclosure, wherein.

DETAILED DESCRIPTION

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Please refer to FIG. 1 to FIG. 8. Embodiments of the present disclosure are described in detail in the following paragraphs. The present disclosure is related to system-in-package chip packaging technology, and is applicable to the system-in-package chip of printer driver system.

Figure 1:
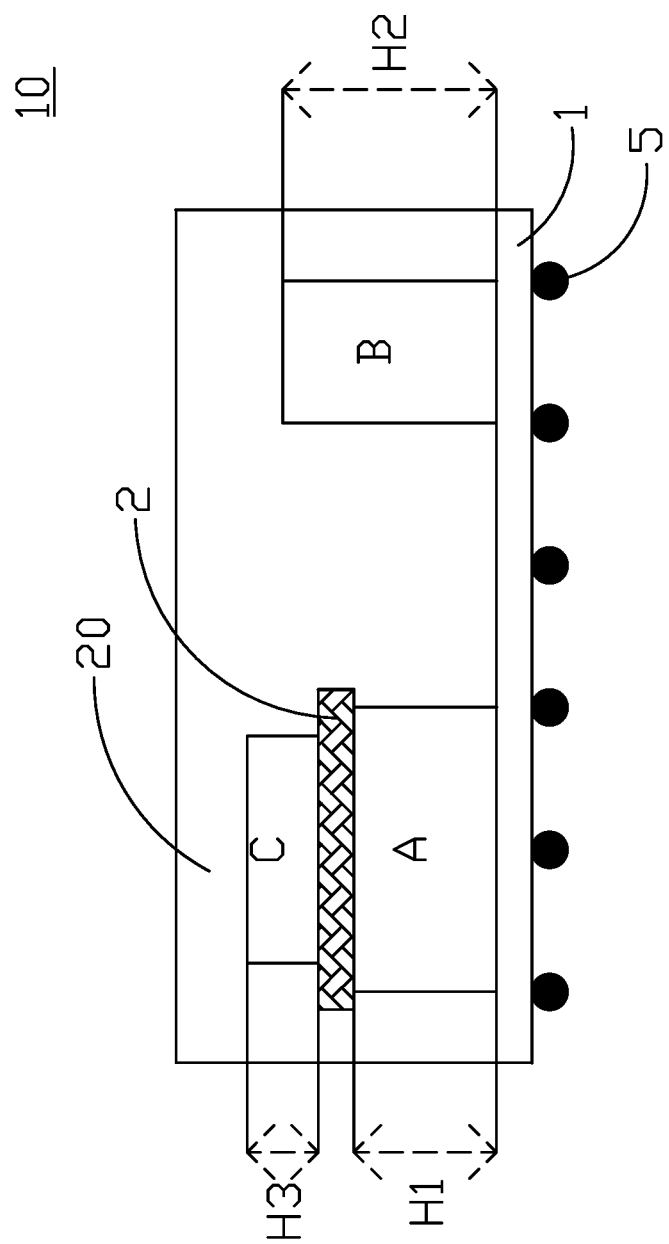
FIG. 1 illustrates a schematic view (1) showing the package according to a first embodiment of the present disclosure.
Figure 2:
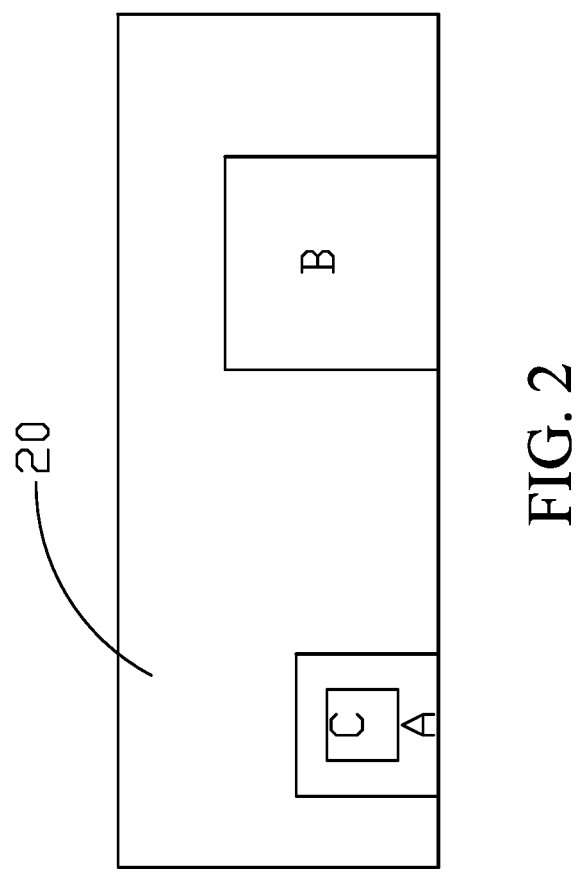
FIG. 2 illustrates a schematic view (2) showing the package according to the first embodiment of the present disclosure.

Please refer to FIG. 1 and FIG. 2. A first embodiment of the present disclosure is illustrated. In this embodiment, a system-in-package device 10 includes a first chip A, a second chip B, and a third chip C which are arranged in a common package 20. The first chip A has a first vertical dimension H1, the second chip B has a second vertical dimension H2, and the third chip C has a third vertical dimension H3. The first chip A and the second chip B are arranged side-by-side in the common package 20, and the third chip C is directly or indirectly disposed on the first chip A. Hence, in this embodiment, the first chip A, the second chip B, and the third chip C are disposed in the common package 20, where the thinner chips are disposed in a stacking structure and a thicker chip and two thinner chips are arranged in parallel with other, thereby reducing the size of the system-in-package device 10.

In this embodiment, the first chip A is a wireless communication chip, the second chip B is a power integrated driver chip, and the third chip C is a printing system single chip. Alternatively, in one embodiment, the first chip A is a wireless communication chip, the second chip B is a printing system single chip, and the third chip C is a power integrated driver chip. Alternatively, in one embodiment, the first chip A is a power integrated driver chip, the second chip B is a wireless communication chip, and the third chip C is a printing system single chip. Alternatively, in one embodiment, the first chip A is a power integrated driver chip, the second chip B is a printing system single chip, and the third chip C is a wireless communication chip. Alternatively, in one embodiment, the first chip A is a printing system single chip, the second chip B is a wireless communication chip, and the third chip C is a power integrated driver chip. Alternatively, in one embodiment, the first chip A is a printing system single chip, the second chip B is a power integrated driver chip, and the third chip C is a wireless communication chip. It is understood that, the type of the chip for the first chip A, the second chip B, and the third chip C can be properly selected based on the practical applications of the device.

Moreover, the common package 20 may be a fan-out wafer-level system-in-package, a fan-out panel system-in-package, or a flip-chip system-in-package.

Figure 3:
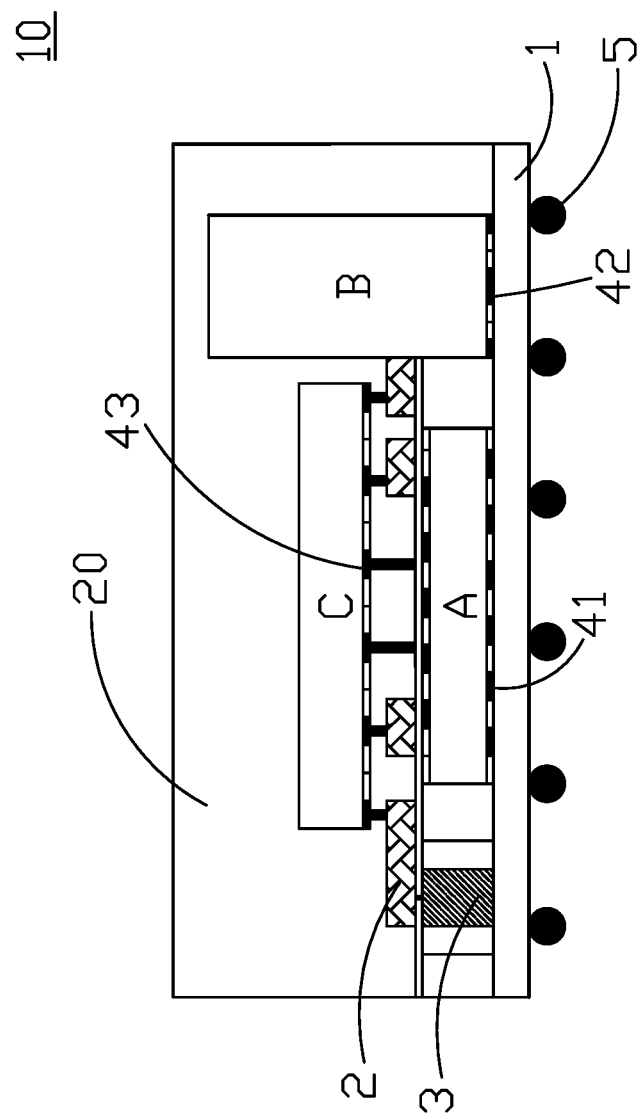
FIG. 3 illustrates a schematic view (3) showing the package according to the first embodiment of the present disclosure.

Please refer to FIG. 1 to FIG. 3, the relationships between components of the device in the first embodiment are further described. The system-in-package device 10 includes a wire carrier structure 2 and between the first chip A and the third chip C in the common package 20. In one embodiment, at least one vertical conductive structure 3 outside a transverse cover region of the first chip A is electrically connected to the first chip A through the wire carrier structure 2, and the wire carrier structure 2 is connected to a carrier 1 through the at least one vertical conductive structure 3. Moreover, in one embodiment, a bottom surface of the carrier 1 is attached to external metal balls 5 so as to be connected to a printed circuit board (PCB). In one embodiment, a bottom surface of the first chip A and a bottom surface of the second chip B are arranged on substantially the same datum plane of the carrier 1. Furthermore, in one embodiment, a contact interface 41 of the bottom surface of the first chip A and a contact interface 42 of the bottom surface of the second chip B are connected to the carrier 1. In one embodiment, a contact interface 43 of a bottom surface of the third chip C is connected to the wire carrier structure 2. Hence, in this embodiment, the first chip A, the second chip B, and the third chip C are partially arranged in parallel and partially stacked with each other, and the chips are electrically connected to each other.

Moreover, in this embodiment, the wire carrier structure 2 is selected from the group consisting of a common front surface redistribution layer structure, a common panel structure, and a common flip-chip substrate, and the carrier 1 is selected from the group consisting of a metal carrier, a fan-out panel, and a flip-chip substrate.

Please refer to FIG. 1 to FIG. 3. The system-in-package device 10 includes at least three chips including a first chip A, a second chip B, and a third chip C arranged in the common package 20. In this embodiment, the first chip A having the first vertical dimension H1, the second chip B having the second vertical dimension H2, and the third chip C having the third vertical dimension H3 are arranged side-by-side or stacked with each other in the common package 20, thereby chips with different vertical dimensions are arranged in the common package 20. In this embodiment, the third vertical dimension H3 of the third chip C is less than the second vertical dimension H2 of the second chip B, and the third chip C can be indirectly arranged on the first chip A in the common package 20. Therefore, the first chip A, the second chip B, and the third chip C may be integrated with each other in advance, and then the first chip A, the second chip B, and the third chip C are packaged and disposed in the common package 20 to form the system-in-package device 10, so as to complete the one-time chip packaging technology to reduce the manufacturing costs of the chip apparently.

Figure 4:
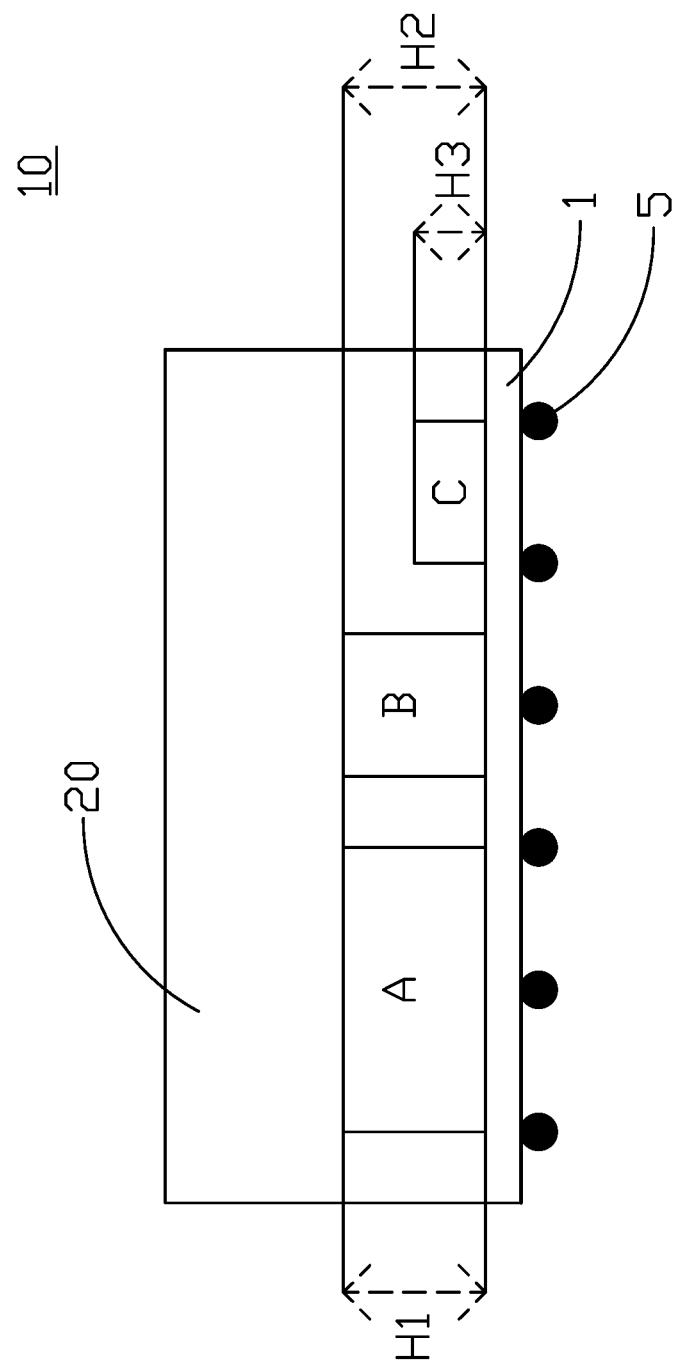
FIG. 4 illustrates a schematic view (1) showing the package according to a second embodiment of the present disclosure.
Figure 5:
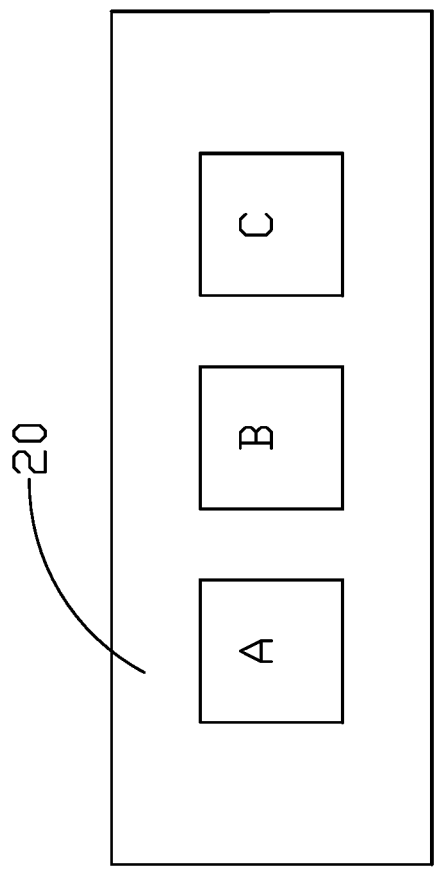
FIG. 5 illustrates a schematic view (2) showing the package according to the second embodiment of the present disclosure.

Please refer to FIG. 4 and FIG. 5. A second embodiment of the present disclosure is illustrated. This embodiment of the present disclosure is related to system-in-package chip packaging technology, and can be applied to the system-in-package chip of printer driver system. In this embodiment, a system-in-package device 10 includes a first chip A, a second chip B, and a third chip C which arranged in a common package 20. The first chip A has a first vertical dimension H1, the second chip B has a second vertical dimension H2, and the third chip C has a third vertical dimension H3. The first chip A, the second chip B, and the third chip C are arranged side-by-side and in parallel in the common package 20.

In this embodiment, the first chip A is a wireless communication chip, the second chip B is a power integrated driver chip, and the third chip C is a printing system single chip. Alternatively, in one embodiment, the first chip A is a wireless communication chip, the second chip B is a printing system single chip, and the third chip C is a power integrated driver chip. Alternatively, in one embodiment, the first chip A is a power integrated driver chip, the second chip B is a wireless communication chip, and the third chip C is a printing system single chip. Alternatively, in one embodiment, the first chip A is a power integrated driver chip, the second chip B is a printing system single chip, and the third chip C is a wireless communication chip. Alternatively, in one embodiment, the first chip A is a printing system single chip, the second chip B is a wireless communication chip, and the third chip C is a power integrated driver chip. Alternatively, in one embodiment, the first chip A is a printing system single chip, the second chip B is a power integrated driver chip, and the third chip C is a wireless communication chip. It is understood that, the type of the chip for the first chip A, the second chip B, and the third chip C can be properly selected based on the practical applications of the device.

Moreover, the common package 20 may be a fan-out wafer-level system-in-package, a fan-out panel system-in-package, or a flip-chip system-in-package.

Figure 6:
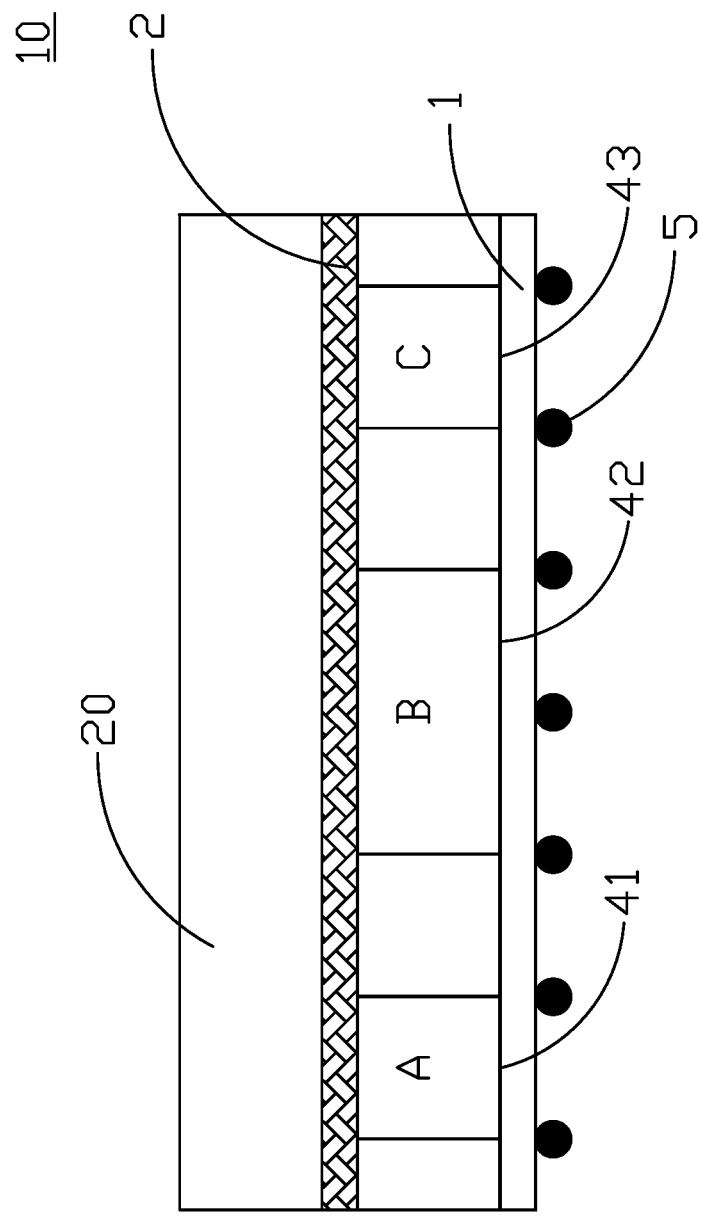
FIG. 6 illustrates a schematic view (3) showing the package according to the second embodiment of the present disclosure.

Please refer to FIG. 4 to FIG. 6. Relationships between components of the device in the second embodiment are further described. The system-in-package device 10 includes a wire carrier structure 2 in the common package 20 and between the first chip A, the second chip B, and the third chip C. In this embodiment, the wire carrier structure 2 is electrically connected to the transverse cover regions of the first chip A, the second chip B, and the third chip C. In this embodiment, a bottom surface of the first chip A, a bottom surface of the second chip B, and a bottom surface of the third chip C are arranged on substantially the same datum plane of the carrier 1. Furthermore, in one embodiment, a contact interface 41 of the bottom surface of the first chip A, a contact interface 42 of the bottom surface of the second chip B, and a contact interface 43 of the bottom surface of the third chip C are connected to the carrier 1. Hence, in this embodiment, the first chip A, the second chip B, and the third chip C are arranged in parallel and side-by-side with each other and are electrically connected to each other.

In this embodiment, the carrier 1 is selected from the group consisting of a metal carrier, a fan-out panel, and a flip-chip substrate.

Please refer to FIG. 4 and FIG. 5. The system-in-package device 10 includes at least three chips arranged in the common package 20. In this embodiment, the first chip A having the first vertical dimension H1, the second chip B having the second vertical dimension H2, and the third chip C having the third vertical dimension H3 are arranged side-by-side in the common package 20. Therefore, chips with different vertical dimensions are arranged in the common package 20. In this embodiment, the third vertical dimension H3 of the third chip C is less than the second vertical dimension H2 of the second chip B. Therefore, the first chip A, the second chip B, and the third chip C may be integrated with each other in advance, and then the first chip A, the second chip B, and the third chip C are packaged and disposed in the common package 20 to form the system-in-package device 10, so as to complete the one-time chip packaging technology to reduce the manufacturing costs of the chip apparently.

Figure 7:
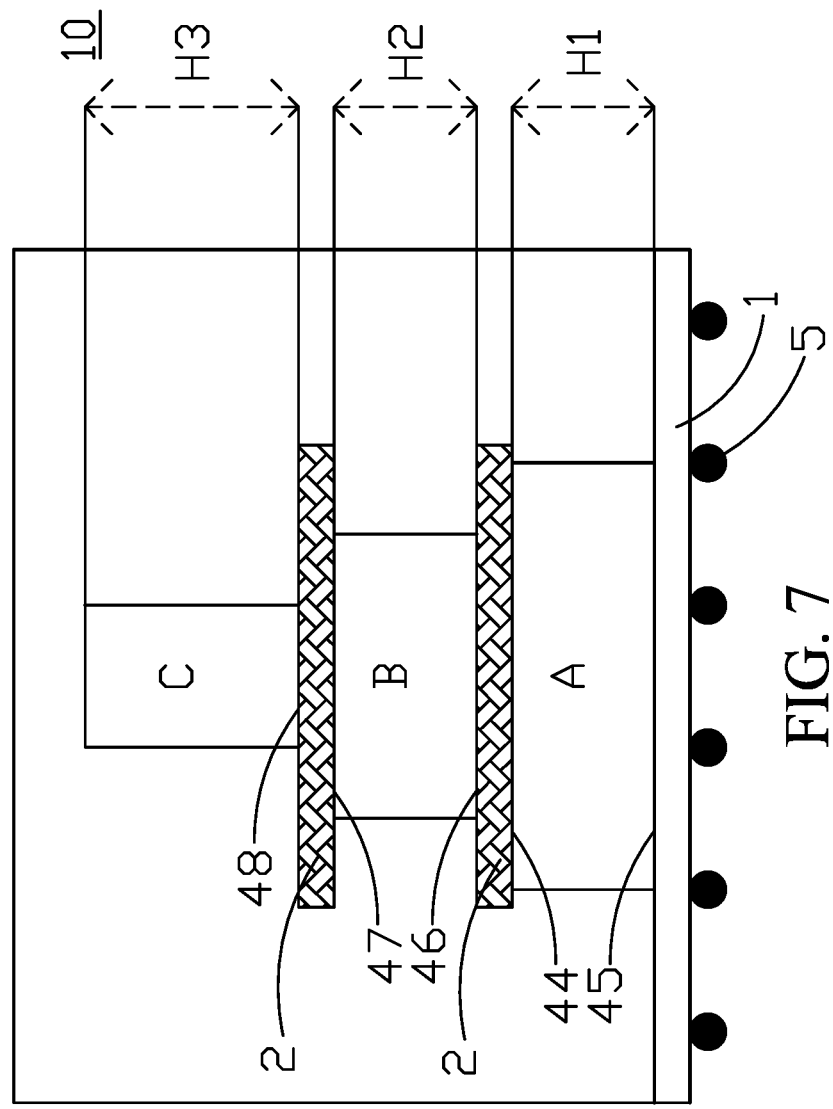
FIG. 7 illustrates a schematic view (1) showing the package according to a third embodiment of the present disclosure.
Figure 8:
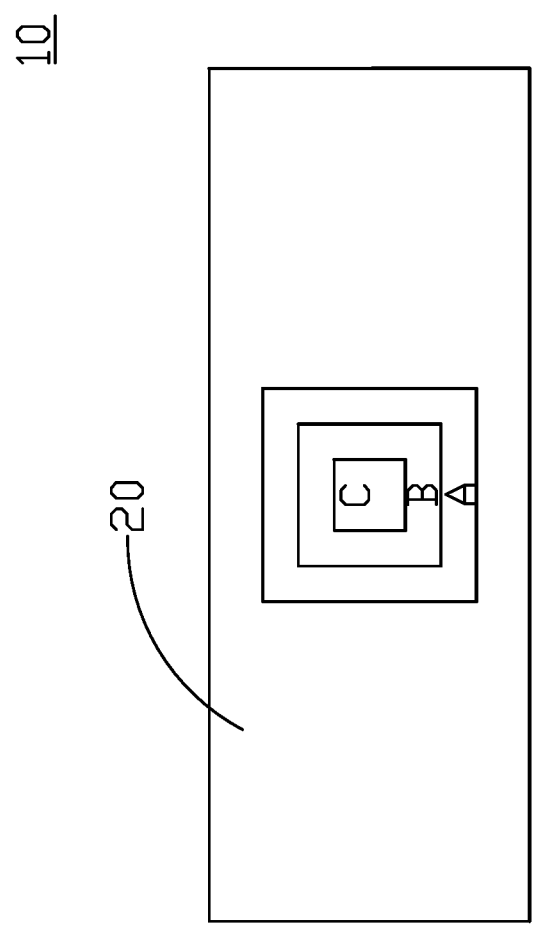
FIG. 8 illustrates a schematic view (2) showing the package according to the third embodiment of the present disclosure.

Please refer to FIG. 7 and FIG. 8. A third embodiment of the present disclosure is illustrated. This embodiment of the present disclosure is related to system-in-package chip packaging technology applicable to the system-in-package chip of printer driver system. In this embodiment, a system-in-package device 10 includes a first chip A, a second chip B, and a third chip C which are arranged in a common package 20. The first chip A has a first vertical dimension H1, the second chip B has a second vertical dimension H2, and the third chip C has a third vertical dimension H3. The first chip A, the second chip B, and the third chip C are stacked with each other and arranged vertically in the common package 20.

In this embodiment, the first chip A is a wireless communication chip, the second chip B is a power integrated driver chip, and the third chip C is a printing system single chip. Alternatively, in one embodiment, the first chip A is a wireless communication chip, the second chip B is a printing system single chip, and the third chip C is a power integrated driver chip. Alternatively, in one embodiment, the first chip A is a power integrated driver chip, the second chip B is a wireless communication chip, and the third chip C is a printing system single chip. Alternatively, in one embodiment, the first chip A is a power integrated driver chip, the second chip B is a printing system single chip, and the third chip C is a wireless communication chip. Alternatively, in one embodiment, the first chip A is a printing system single chip, the second chip B is a wireless communication chip, and the third chip C is a power integrated driver chip. Alternatively, in one embodiment, the first chip A is a printing system single chip, the second chip B is a power integrated driver chip, and the third chip C is a wireless communication chip. It is understood that, the type of the chip for the first chip A, the second chip B, and the third chip C can be properly selected based on the practical applications of the device.

Moreover, the common package 20 may be a fan-out wafer-level system-in-package, a fan-out panel system-in-package, or a flip-chip system-in-package.

Please refer to FIG. 7 and FIG. 8. Relationships between components of the device in the third embodiment are further described. The system-in-package device 10 includes two wire carrier structures 2 in the common package 20 and between the first chip A and the second chip B, as well as between the first chip B and the third chip C. In this embodiment, the wire carrier structures 2 is located at a longitudinal cover region of the first chip A, the second chip B, and the third chip C and electrically connected to them. In this embodiment, a contact interface 44 of a top surface of the first chip A is connected to the wire carrier structure 2, a contact interface 45 of a bottom surface of the first chip A is connected to the carrier 1, a contact interface 46 of a top surface of the second chip B and a contact interface 47 of a bottom surface of the second chip B are connected to the wire carrier structure 2, respectively, and a contact interface 48 of a bottom surface of the third chip C is connected to the wire carrier structure 2. Hence, in this embodiment, the first chip A, the second chip B, and the third chip C are arranged vertically and stacked with each other and are electrically connected to each other.

In this embodiment, the carrier 1 is selected from the group consisting of a metal carrier, a fan-out panel, and a flip-chip substrate.

Please refer to FIG. 7 and FIG. 8. The system-in-package device 10 includes at least three chips arranged in the common package 20. In this embodiment, the first chip A having the first vertical dimension H1, the second chip B having the second vertical dimension H2, and the third chip C having the third vertical dimension H3 are arranged vertically and stacked with each other in the common package 20. Therefore, chips with different vertical dimensions are arranged in the common package 20. In this embodiment, the third vertical dimension H3 of the third chip C is greater than the second vertical dimension H2 of the second chip B, the second chip B is directly or indirectly disposed on the first chip A, and the third chip C is directly or indirectly disposed on the first chip A. Therefore, the first chip A, the second chip B, and the third chip C may be integrated with each other in advance, and then the first chip A, the second chip B, and the third chip C are packaged and disposed in the common package 20 to form the system-in-package device 10, so as to complete the one-time chip packaging technology to reduce the manufacturing costs of the chip apparently.

Regardless in the first embodiment, the second embodiment, or the third embodiment, although three chips are described and illustrated in the figures and corresponding contents in these embodiments, more than three chips may be provided in the common package 20 in actual practices.

In summary, according to one or some embodiments of the present disclosure, the system-in-package device 10 includes an internal redistribution structure to achieve the electrical connection between the first chip A, the second chip B, and the third chip C therein or the electrical connection between an external device (or a printed circuit board) and one or more chip (e.g., the third chip C) in the common package 20 without being directly connected to the front surface of the system-in-package device 10. The internal redistribution structure may include at least one structured metal layer (e.g., copper layer) provided as the embedded wiring in the electrical insulated material.

As mentioned above, in one or some embodiments of the present disclosure, a system-in-package chip of printer drive system is provided. In the system-in-package device 10, the first chip A, the second chip B, and the third chip C are packaged one-time in the common package 20, thereby effectively improving the existing packaging procedure rather than packaging one single chip in at one packaging procedure. Moreover, the wireless communication chip or the power integrated driver chip or the printing system single chip can be selected as the first chip A, the second chip B, and the third chip C based on practical applications of the device. Comparing with the packaging method known to the inventor wherein the number of packaging procedure relies on the number of chips to be packaged, the system-in-package chip of one or some embodiments of the present invention can package multiple chips at one time, thereby effectively reducing manufacturing costs and the size of the packaged components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system-in-package chip of printer driver system applicable in a printer comprising a first chip, a second chip, and a third chip which are arranged in a common package;
   wherein the first chip and the second chip are arranged side-by-side on a carrier in the common package;
   wherein the third chip is arranged on a top portion of the first chip in the common package;
   wherein a wire carrier structure is formed on the top portion of the first chip before the third chip is disposed on the first chip.

2. The system-in-package chip of printer driver system according to claim 1, wherein at least one vertical conductive structure outside a transverse cover region of the first chip is connected to the first chip through the wire carrier structure.

3. The system-in-package chip of printer driver system according to claim 2, wherein the wire carrier structure is connected to the carrier through the at least one vertical conductive structure.

4. The system-in-package chip of printer driver system according to claim 1, wherein a bottom surface of the first chip and a bottom surface of the second chip are arranged on substantially the same datum plane of the carrier.

5. The system-in-package chip of printer driver system according to claim 1, wherein a contact interface of a bottom surface of the first chip and a contact interface of a bottom surface of the second chip are connected to the carrier.

6. The system-in-package chip of printer driver system according to claim 1, wherein a contact interface of a bottom surface of the third chip is connected to the wire carrier structure.

7. The system-in-package chip of printer driver system according to claim 1, wherein the wire carrier structure is selected from the group consisting of a common front surface redistribution layer structure, a common panel structure, and a common flip-chip substrate.

8. The system-in-package chip of printer driver system according to claim 1, wherein the carrier is selected from the group consisting of a metal carrier, a fan-out panel, and a flip-chip substrate.

9. The system-in-package chip of printer driver system according to claim 1, wherein the common package is a fan-out wafer-level system-in-package, a fan-out panel system-in-package, or a flip-chip system-in-package.

10. The system-in-package chip of printer driver system according to claim 1, wherein a bottom surface of the carrier is attached to external metal balls so as to be connected to a printed circuit board.

11. The system-in-package chip of printer driver system according to claim 1, wherein the first chip is a wireless communication chip, the second chip is a power integrated driver chip, and the third chip is a printing system single chip.

12. The system-in-package chip of printer driver system according to claim 1, wherein the first chip is a wireless communication chip, the second chip is a printing system single chip, and the third chip is a power integrated driver chip.

13. The system-in-package chip of printer driver system according to claim 1, wherein the first chip is a power integrated driver chip, the second chip is a wireless communication chip, and the third chip is a printing system single chip.

14. The system-in-package chip of printer driver system according to claim 1, wherein the first chip is a power integrated driver chip, the second chip is a printing system single chip, and the third chip is a wireless communication chip.

15. The system-in-package chip of printer driver system according to claim 1, wherein the first chip is a printing system single chip, the second chip is a wireless communication chip, and the third chip is a power integrated driver chip.

16. The system-in-package chip of printer driver system according to claim 1, wherein the first chip is a printing system single chip, the second chip is a power integrated driver chip, and the third chip is a wireless communication chip.

17. A system-in-package chip of printer driver system applicable in a printer comprising a first chip, a second chip, and a third chip which are arranged in a common package;
wherein the first chip, the second chip, and the third chip are arranged in parallel and side-by-side in the common package.

18. A system-in-package chip of printer driver system applicable in a printer comprising a first chip, a second chip, and a third chip which are arranged in a common package;
wherein the first chip, the second chip, and the third chip are arranged vertically and stacked with each other in the common package.

* * * * *